US011973478B2

United States Patent
Zhang et al.

(10) Patent No.: US 11,973,478 B2
(45) Date of Patent: Apr. 30, 2024

(54) SINGLE-TO-DIFFERENTIAL CONVERTER

(71) Applicant: GLOBALFOUNDRIES U.S. Inc., Malta, NY (US)

(72) Inventors: Xu Zhang, Beijing (CN); Mingming Zhang, Beijing (CN); Hanqing Zhao, Beijing (CN); Lukun Zhai, Beijing (CN); Dan Liu, Beijing (CN); Xuan Li, Beijing (CN)

(73) Assignee: GlobalFoundries U.S. Inc., Malta, NY (US)

( * ) Notice: Subject to any disclaimer, the term of this patent is extended or adjusted under 35 U.S.C. 154(b) by 455 days.

(21) Appl. No.: 17/464,763

(22) Filed: Sep. 2, 2021

(65) Prior Publication Data

US 2023/0066864 A1 Mar. 2, 2023

(51) Int. Cl.
*H03F 3/45* (2006.01)
*H04B 10/69* (2013.01)
*H03F 3/08* (2006.01)

(52) U.S. Cl.
CPC ..... *H03F 3/45475* (2013.01); *H04B 10/6911* (2013.01)

(58) Field of Classification Search
CPC .......... H03F 3/45475; H03F 3/08; H03F 3/26; H04B 10/6911; H04B 10/69
USPC ................. 330/252–261, 308, 301
See application file for complete search history.

(56) References Cited

U.S. PATENT DOCUMENTS

| | | | |
|---|---|---|---|
| 7,305,190 B2 | 12/2007 | Mayampurath et al. | |
| 9,413,305 B2 | 8/2016 | Zhou et al. | |
| 9,525,386 B2 | 12/2016 | Ide et al. | |
| 9,590,738 B2 * | 3/2017 | Morita | H03F 3/72 |
| 9,705,457 B2 | 7/2017 | Kim et al. | |
| 10,193,636 B1 | 1/2019 | Saeedi et al. | |
| 10,333,516 B2 | 6/2019 | Li et al. | |
| 11,249,499 B2 * | 2/2022 | Kurylak | H03F 1/0211 |
| 2007/0226771 A1 | 9/2007 | Nagahori | |
| 2011/0129235 A1 | 6/2011 | Le et al. | |
| 2019/0173588 A1 | 6/2019 | Ahmed et al. | |

FOREIGN PATENT DOCUMENTS

WO 8002092 A1 10/1980

OTHER PUBLICATIONS

Lakshmikumar et al., A Process and Temperature Insensitive CMOS Linear TIA for 100 GB/s/λ PAM-4 Optical Links, IEEE Journal of Solid-State Circuits, vol. 54, No. 11, 2019, pp. 3180-3190.

(Continued)

*Primary Examiner* — Hieu P Nguyen
(74) *Attorney, Agent, or Firm* — David Cain; Hoffman Warnick LLC

(57) ABSTRACT

Apparatuses include (among other components) a first gain device connected to receive an initial voltage, a second gain device in series with the first gain device and connected to receive output of the first gain device, differential gain devices connected to receive outputs from the first gain device and the second gain device (the differential gain devices provide opposite voltage outputs from the apparatus) and high-frequency compensation feed-forward paths connected to the first gain device and the second gain device.

20 Claims, 3 Drawing Sheets

(56) References Cited

OTHER PUBLICATIONS

Li et al., "A 112 GB/s PAM4 Linear TIA with 0.96 pJ/bit Energy Efficiency in 28 nm CMOS", IEEE 44th European Solid State Circuits Conference (ESSCIRC), Dresden, Germany, 2018, pp. 238-241.
Morita et al., "A 12×5 Two-Dimensional Optical I/O Array for 600Gb/s Chip-to-Chip Interconnect in 65nm CMOS", IEEE International Solid-State Circuits Conference, 2014, pp. 140-141.
Gwynne-Timothy et al., "Wireless Transmitter Bandwidth Extension Using Dynamically Varying Capacitors," IEEE 28th Canadian Conference on Electrical and Computer Engineering (CCECE), 2015, pp. 202-207.
Taiwanese Examination Report for corresponding TW Application No. 111128945 dated Feb. 21, 2023, 5 pages.

\* cited by examiner

SINGLE-TO-DIFFERENTIAL CONVERTER

BACKGROUND

Field of the Invention

The present disclosure relates to single-to-differential converters, and more specifically, to single-to-differential converters used in optical receivers.

Description of Related Art

Optical receivers are often used to receive pulses of light that represent data. In optical receivers, a photosensor, such as a photodiode, receives an optical signal and, in response, outputs a current. A single-to-differential (S2D) converter receives the current and outputs a differential voltage signal (i.e., converts the current signal into a differential voltage signal). The S2D converter can include a transimpedance amplifier (TIA), which receives the current output from the photodiode and outputs an initial voltage (Vin); and a single-to-differential (S2D) amplifier device, which generates positive and negative voltage outputs (i.e., the differential voltage signal) from the initial voltage (Vin). A differential amplifier amplifies the positive and negative voltages and outputs the amplified voltages to an analog to digital (ADC) converter, which provides a digital output that is decoded into data by communications equipment.

SUMMARY

According to one embodiment herein, apparatuses include (among other components) a first gain device connected to receive an initial voltage, a second gain device in series with the first gain device and connected to receive output of the first gain device, differential gain devices connected to receive outputs from the first gain device and the second gain device (the differential gain devices provide opposite voltage outputs from the apparatus) and high-frequency compensation feed-forward paths connected to the first gain device and the second gain device.

Additional apparatuses herein include (among other components) a first amplifier connected to receive an initial voltage, a second amplifier in series with the first amplifier and connected to receive output of the first amplifier, differential amplifiers connected to receive outputs from the first amplifier and the second amplifier (the differential amplifiers provide opposite voltage outputs from the apparatus), and high-frequency compensation feed-forward paths connected to the first amplifier and the second amplifier.

Further apparatuses herein include (among other components) a photodiode outputting a current, a transimpedance amplifier connected to receive the current (the transimpedance amplifier is adapted to output an initial voltage), and a single-to-differential converter. The single-to-differential converter includes (among other components) a first amplifier connected to receive the initial voltage, a second amplifier in series with the first amplifier and connected to receive output of the first amplifier, differential amplifiers connected to receive outputs from the first amplifier and the second amplifier (the differential amplifiers provide opposite voltage outputs from the apparatus), and high-frequency compensation feed-forward paths connected to the first amplifier and the second amplifier.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, in optical receivers a transimpedance amplifier (TIA) receives current from a photodiode and outputs an initial voltage. A single-to-differential (S2D) converter provides positive and negative voltage outputs from the initial voltage to a differential amplifier. The single-to-differential converter takes a relatively weak input current and outputs a large amplitude voltage (high bandwidth and gain). However, achieving higher peaking amplitude and higher bandwidth within single-to-differential converters could be at the cost of decreased gain, increased phase difference, increased chip area (footprint) consumed, etc.

For example, inductors are relatively large circuit components and their use to provide increased bandwidth and gain can consume a large amount of the available footprint on a chip. Adding positive feedback loops to increase gain can result in a very limited bandwidth extension and, similarly, using resonant frequency tuning elements to reduce phase difference can result in a structure with a narrow bandwidth.

With this in mind and in order to provide single-to-differential converters that produce relatively high peaking amplitude and bandwidth, without suffering undesirable decreases in gain and/or increases in phase difference and footprint, the single-to-differential converters discussed herein include high frequency compensation elements connected to the gain devices to reduce the phase shift and bandwidth differences. More specifically, instead of using large footprint inverters or bandwidth limiting devices, with the single-to-differential converter structure discussed below feed-forward paths are connected to relatively very high gain devices to compensate for the poles introduced by the gain devices.

Figure 1:
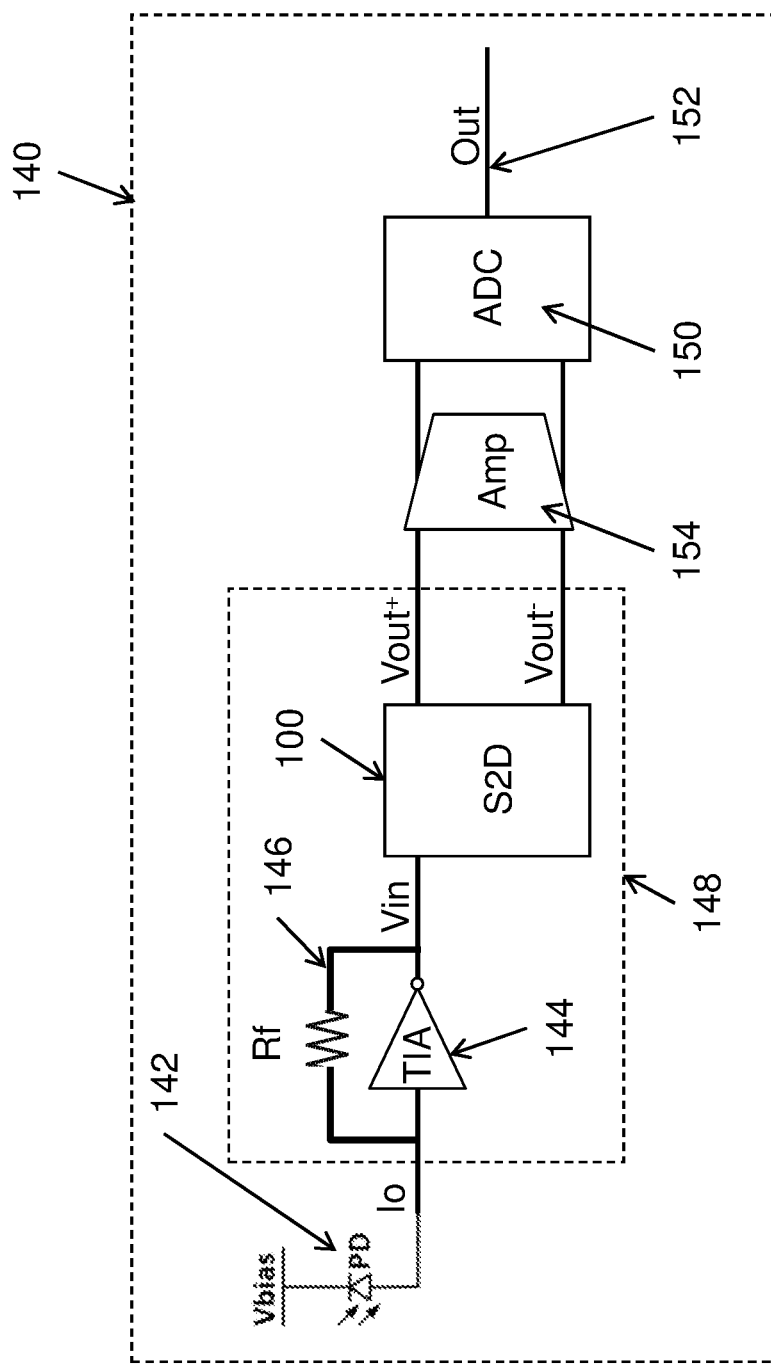
FIG. 1 is a schematic diagram illustrating an optical receiver system according to embodiments herein.

FIG. 1 is a schematic diagram illustrating an example of an optical receiver 140. This optical receiver 140 includes some form of photosensor, such as a photodiode 142, that receives an optical signal and that, in response to the optical signal, outputs a current (Io). The optical receiver 140 further includes a transimpedance amplifier (TIA) 144 (having a resistive feedback loop 146), which is connected to the photodiode 142, receives the current (Io) from the photodiode 142 and, based on the current (Io), outputs an initial voltage (Vin).

The optical receiver 140 further includes a single-to-differential amplifier device (S2D) 100 (that is also discussed in greater detail below), which is connected to the transimpedance amplifier 144 and converts the initial voltage (Vin) into positive and negative voltages (e.g., Vout$^+$, Vout$^-$). It should be noted that, in combination, the transimpedance amplifier 144 and the S2D amplifier device 100 can form a first stage (also referred to herein as an amplifier stage) and a second stage (also referred to herein as a post-amplifier stage), respectively, of a S2D converter 148, which receives a current (Io) output from a photodiode 142 and which ultimately converts that current (Io) into positive and negative voltages (e.g., Vout$^+$, Vout$^-$).

The optical receiver 140 can also include an amplifier device 154 (also referred to herein as a differential amplifier device) and an analog-to-digital converter (ADC) 150. The differential amplifier device 154 can be connected to the S2D device 100, can receive the positive and negative voltages (e.g., Vout$^+$, Vout$^-$), and can output amplified positive and negative voltages (i.e., an amplified differential voltage signal) to the ADC 150. The analog-to-digital converter (ADC) 150 receives the amplified differential voltage signal output by the amplifier device 154 and converts this amplified differential voltage signal into a digital output signal 152, which is then provided to other communication devices that process the digital signal into data and other useful information.

Figure 2:
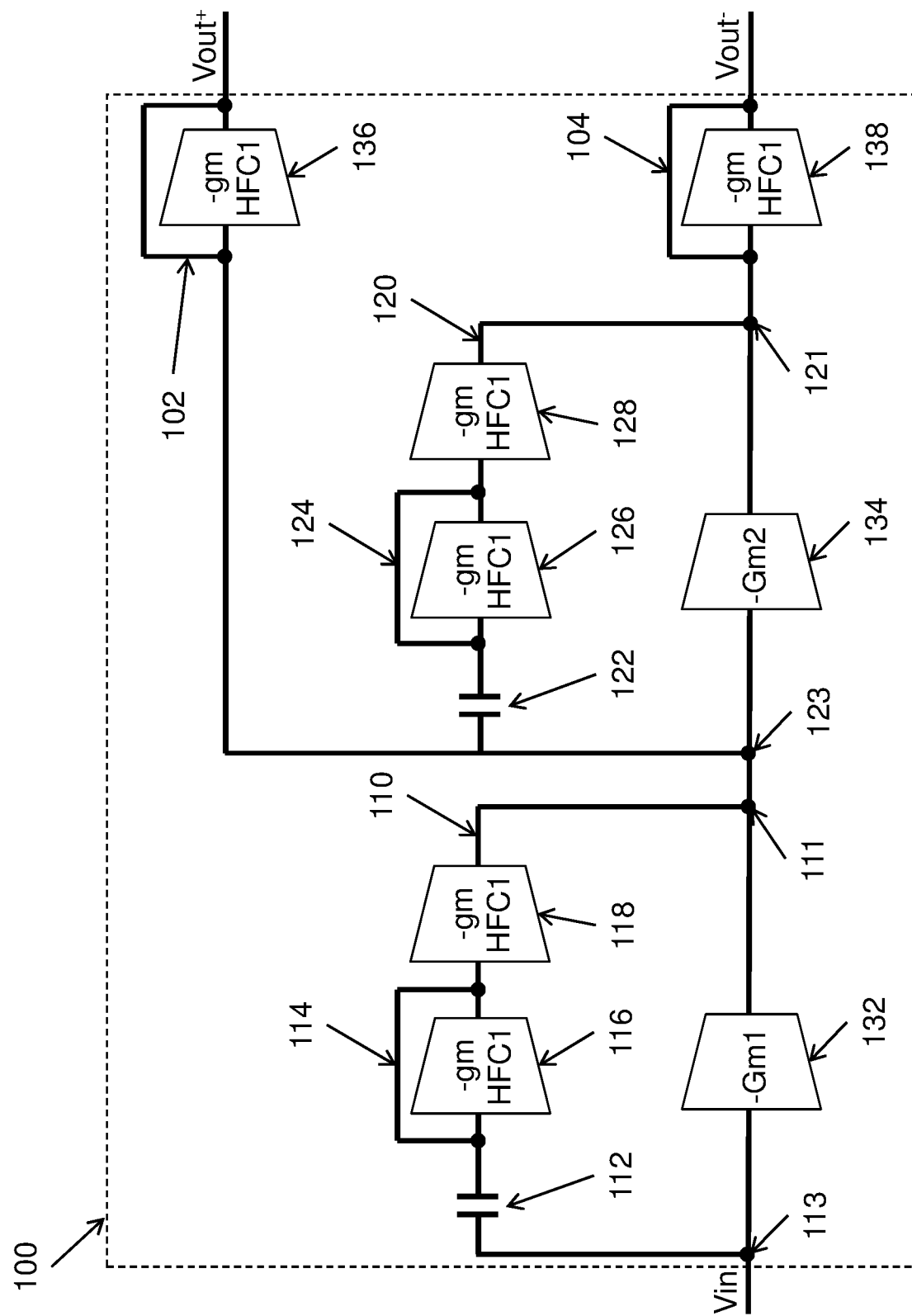
FIGS. 2 and 3 are schematic diagrams illustrating single-to-differential (S2D) converter according to embodiments herein.

FIG. 2 is a schematic diagram illustrating an exemplary single-to-differential (S2D) amplifier device 100 that can be incorporated into the S2D converter 148 of the optical receiver 140 of FIG. 1. This S2D amplifier device 100 includes, among other components, a first gain device 132 connected to receive the initial voltage (Vin) (e.g., from the TIA 144, as discussed above), and a second gain device 134 in series with the first gain device 132 and connected to receive output of the first gain device 132. Differential gain devices 136, 138 are connected to receive outputs from the first gain device 132 and the second gain device 134 (the differential gain devices 136, 138 provide opposite voltage outputs from the apparatus). Further, high-frequency compensation feed-forward paths 110, 120 are connected to the first gain device 132 and the second gain device 134. The "gain devices" herein are any form of device that is adapted to or configured to provide "gain" (e.g., increase in power, voltage, current, etc.) of a signal within a system and can include, for example, any form of amplifier (amplifiers or operational amplifiers, inverting or non-inverting, etc.), relays, sensors, bipolar transistors, etc.

The high-frequency compensation feed-forward paths 110, 120 each have gain devices and a capacitor. Specifically, the high-frequency compensation feed-forward paths 110, 120 each have a first frequency compensation gain device 118, 128, a second frequency compensation gain device 116, 126 in series with each other, a feed-forward path 114, 124 connected to the second frequency compensation gain device 116, 126 (e.g., forming DC-bias supplies), and a capacitor 112, 122 in series with the first frequency compensation gain device 118, 128 and the second frequency compensation gain device 116, 126. The second frequency compensation gain device 116, 126 and the capacitor 112, 122 are outside the feed-forward paths 114, 124. An input node of the first frequency compensation gain device 118, 128 is connected to a first node 111, 121 and the capacitor 112, 122 is connected to a second node 113, 123. The first node 111, 121 and the second node 113, 123 are in series with the first gain device 132 and the second gain device 134.

The first gain device 132 and a first of the high-frequency compensation feed-forward paths (feed-forward path 110) form what is referred to as a "main path" of the single-to-differential device 100, while the second gain device 134 and a second of the high-frequency compensation feed-forward paths (feed-forward path 120) form what is referred to as a "differential converter" of the single-to-differential device 100.

Figure 3:
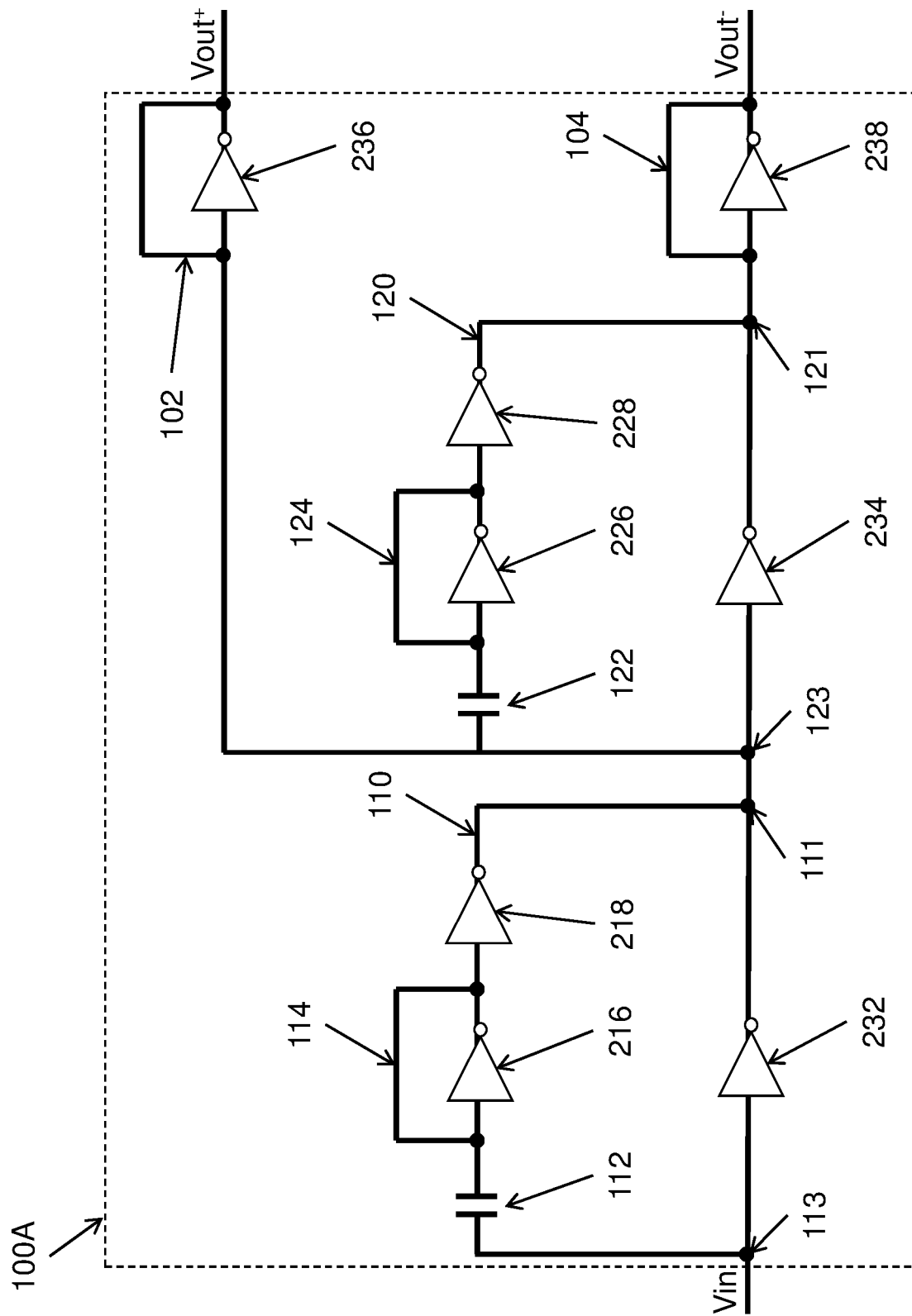

FIG. 3 is a schematic diagram illustrating an alternative single-to-differential (S2D) amplifier device 100 that can be incorporated into the S2D converter 148 of the optical receiver 140 of FIG. 1. This single-to-differential (S2D) amplifier device 100A is similar to the single-to-differential (S2D) amplifier device 100 shown in FIG. 2 and includes many of the same components (that share the same identification numbers as used in FIG. 2). However, in the structure shown in FIG. 3, the single-to-differential (S2D) amplifier device 100A uses inverter structures (also referred to as inverting amplifiers or inverting operational (op) amplifiers) in place of the more generic gain devices used in the structure shown in FIG. 2.

Therefore, FIG. 3 illustrates a single-to-differential (S2D) amplifier device 100A of an S2D converter 144 that includes, among other components, a first inverting amplifier 232 connected to receive the initial voltage (Vin), and a second inverting amplifier 234 in series with the first inverting amplifier 232 and connected to receive output of the first inverting amplifier 232. Differential inverting amplifiers 236, 238 are connected to receive outputs from the first inverting amplifier 232 and the second inverting amplifier 234 (the differential inverting amplifiers 236, 238 provide opposite voltage outputs from the apparatus). Also, high-frequency compensation feed-forward paths 110, 120 are connected to the first inverting amplifier 232 and the second inverting amplifier 234.

The high-frequency compensation feed-forward paths 110, 120 each have amplifiers and a capacitor. Specifically, the high-frequency compensation feed-forward paths 110, 120 each have a first frequency compensation inverting amplifier 218, 228, a second frequency compensation inverting amplifier 216, 226 in series with each other, a feed-forward path 114, 124 connected to the second frequency compensation inverting amplifier 216, 226, and a capacitor 112, 122 in series with the first frequency compensation inverting amplifier 218, 228 and the second frequency compensation inverting amplifier 216, 226. The second frequency compensation inverting amplifier 216, 226 and the capacitor 112, 122 are outside the feed-forward paths 114, 124. An input node of the first frequency compensation inverting amplifier 218, 228 is connected to a first node 111, 121 and the capacitor 112, 122 is connected to a second node 113, 123. The first node 111, 121 and the second node 113, 123 are in series with the first inverting amplifier 232 and the second inverting amplifier 234.

The first inverting amplifier 232 and a first of the high-frequency compensation feed-forward paths (feed-forward path 110) form what is referred to as a "main path" of the single-to-differential device 100A, while the second inverting amplifier 234 and a second of the high-frequency compensation feed-forward paths (feed-forward path 120) form what is referred to as a "differential converter" of the single-to-differential device 100A.

With the above structures, because the high frequency compensation feed-forward paths 110, 120 are connected to the gain devices 132, 134 and amplifiers 232, 234, this reduces the phase shift and also reduces bandwidth differences. Thus, instead of using relatively very large footprint inductors or bandwidth limiting devices (e.g., positive feedback loops, resonant frequency tuning elements, etc.) these single-to-differential (S2D) amplifier devices (100, 100A), which can be incorporated into the single-to-differential (S2D) converter 148, use feed-forward paths 110, 120 with relatively very high gain devices (132, 134, 232, 234) to compensate for the poles introduced by the gain devices (132, 134, 232, 234). This produces high gain without phase shift and without consuming large circuit areas.

With respect to phase differences, using an exemplary transfer function of the structure shown in FIG. 1, it can be seen that the phase difference is not increased by this structure. Specifically, one exemplary implementation the transfer function (H(s)) can be represented as follows:

$$H(s) = -\frac{Ro(gm1 + (C1 + Cpar)gm1Reqs + C1gmfReqs)}{(1 + (C1 + Cpar)Reqs)(1 + CoRos)}$$

Where, in the above transfer function, gmf is the gain of the frequency compensation gain devices (items 116, 118, 126, 128 in FIG. 2) or amplifiers (items 216, 218, 226, 228 in FIG. 3), gm1 is the gain of the gain devices (items 132, 134 in FIG. 2) or amplifiers (items 232, 234 in FIG. 3), C1 is the capacitance of the feed-forward path capacitors (items 112, 122 in FIGS. 2 and 3), Cpar is the parasitic capacitance of the frequency compensation gain devices (items 116, 118, 126, 128 in FIG. 1) or amplifiers (items 216, 218, 226, 228 in FIG. 3), Co is the capacitance of the loads of the differential gain devices (items 136, 138 in FIG. 2) or differential inverting amplifiers (items 236, 238 in FIG. 3), Ro is the resistance of the loads of the differential gain devices (items 136, 138 in FIG. 1) or differential inverting amplifiers (items 236, 238 in FIG. 3), and Reqs is the resistance of the frequency compensation gain devices (items 116, 118, 126, 128 in FIG. 1) or in amplifiers (items 216, 218, 226, 228 in FIG. 3). The poles ($\omega_{p1}$, $\omega_{p2}$) of the structure can be identified using the following functions:

$$\omega_{p1} = \frac{1}{(C1 + Cpar)Req}$$

$$\omega_{p2} = \frac{1}{CoRo}$$

Further, Zero ($\omega_z$) can be identified using:

$$\omega_z = \frac{1}{\left(C1 + Cpar + \frac{gmf}{gm1}\right)Req}$$

With the above functions, Zero ($\omega_z$) is smaller than Pole 1 ($\omega_{p1}$) and this adds a peaking effect to the transfer function. Also, Zero ($\omega_z$) and Pole 1 ($\omega_{p1}$) are close to each other, which causes them to cancel each other out at sufficient frequency.

Further, the structures disclosed herein extend bandwidth without affecting the group delay. Group delay is defined as the rate of change of transmission phase angle with respect to frequency, as shown below:

$$GroupDelay(\omega) = -\frac{d}{d\omega}\theta(\omega)$$

Additionally, the ratio of gmf/gm1 is $\alpha$. It is useful to make $\alpha \times C1$ large enough to get good peaking effect considering that there is a trade-off between $\alpha$ and C1. Specifically, a larger $\alpha$ will produce a higher peaking amplitude and higher bandwidth with a reduce gain at low frequencies and consume more power. A larger C1 will also produce a higher peaking amplitude and higher bandwidth but will provide constant gain a lower frequencies. Additionally, a larger C1 will consume more chip area (footprint) and introduce more parasitic capacitance to ground. However, with either higher a or C1, a phase shift is not produced with the structures herein because, since Zero ($\omega_z$) and Pole 1 ($\omega_{p1}$) are close to each other, the phase is dominated by the output pole.

With respect to relative sizes of circuit devices, a single-to-differential (S2D) amplifier device 100 or 100A as discussed above can very easily consume less chip area than a single inductor of those gain structures that use multiple inductors, even when the single-to-differential (S2D) amplifier device 100 or 100A discussed above produces the same or more gain than such inductor-based gain devices.

Therefore, by including high frequency compensation elements connected to the gain devices, the structures herein reduce the phase shift and bandwidth differences. Additionally, this is done without using large inductors, which can make the structures herein less than one-tenth the size of devices that use inductors, while still achieving the same or greater increase in bandwidth and gain of the larger devices (e.g., multiples of inductor-based devices). Also, the devices herein can be formed on lower layers within multi-layer integrated circuit devices relative to where inductor-based devices are formed; and this, combined with the relatively small size of these structures, allows easy integration to existing designs.

The terminology used herein is for the purpose of describing particular embodiments only and is not intended to be limiting of the foregoing. As used herein, the singular forms "a," "an," and "the" are intended to include the plural forms as well, unless the context clearly indicates otherwise.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein.

What is claimed is:

1. An apparatus comprising:
   a first gain device connected to receive an initial voltage;
   a second gain device in series with the first gain device and connected to receive an output of the first gain device;
   differential gain devices connected to receive outputs from the first gain device and the second gain device, wherein the differential gain devices are connected to provide opposite voltage outputs from the apparatus; and high-frequency compensation feed-forward paths connected to the first gain device and the second gain device.

2. The apparatus according to claim 1, wherein the high-frequency compensation feed-forward paths each comprises gain devices and a capacitor.

3. The apparatus according to claim 1, wherein the high-frequency compensation feed-forward paths each comprise:
 a first frequency compensation gain device;
 a second frequency compensation gain device in series with the first frequency compensation gain device;
 a feed-forward path connected to the second frequency compensation gain device; and
 a capacitor in series with the first frequency compensation gain device and the second frequency compensation gain device.

4. The apparatus according to claim 3, wherein the second frequency compensation gain device and the capacitor are outside the feed-forward path.

5. The apparatus according to claim 3, wherein an input node of the first frequency compensation gain device is connected to a first node,
 wherein the capacitor is connected to a second node, and
 wherein the first node and the second node are in series with the first gain device and the second gain device.

6. The apparatus according to claim 1, wherein the first gain device and a first of the high-frequency compensation feed-forward paths form a main path of a post gain device, and
 wherein the second gain device and a second of the high-frequency compensation feed-forward paths form a differential converter.

7. The apparatus according to claim 1, wherein the differential gain devices comprise at least one gain device and a resistor/capacitor circuit.

8. An apparatus comprising:
 a first amplifier connected to receive an initial voltage;
 a second amplifier in series with the first amplifier and connected to receive output of the first amplifier;
 differential amplifiers connected to receive outputs from the first amplifier and the second amplifier, wherein the differential amplifiers are connected to provide opposite voltage outputs from the apparatus; and
 high-frequency compensation feed-forward paths connected to the first amplifier and the second amplifier.

9. The apparatus according to claim 8, wherein the high-frequency compensation feed-forward paths each comprises amplifiers and a capacitor.

10. The apparatus according to claim 8, wherein the high-frequency compensation feed-forward paths each comprise:
 a first frequency compensation amplifier;
 a second frequency compensation amplifier in series with the first frequency compensation amplifier;
 a feed-forward path connected to the second frequency compensation amplifier; and
 a capacitor in series with the first frequency compensation amplifier and the second frequency compensation amplifier.

11. The apparatus according to claim 10, wherein the second frequency compensation amplifier and the capacitor are outside the feed-forward path.

12. The apparatus according to claim 10, wherein an input node of the first frequency compensation amplifier is connected to a first node,
 wherein the capacitor is connected to a second node, and
 wherein the first node and the second node are in series with the first amplifier and the second amplifier.

13. The apparatus according to claim 8, wherein the first amplifier and a first of the high-frequency compensation feed-forward paths form a main path of a post amplifier, and
 wherein the second amplifier and a second of the high-frequency compensation feed-forward paths form a differential converter.

14. The apparatus according to claim 8, wherein the differential amplifiers comprise at least one amplifier and a resistor/capacitor circuit.

15. An apparatus comprising:
 a photodiode outputting a current; and
 a single-to-differential converter comprising:
  a transimpedance amplifier connected to receive the current, wherein the transimpedance amplifier is adapted to output an initial voltage; and
  a single-to-differential amplifier device comprising:
   a first amplifier connected to receive the initial voltage;
   a second amplifier in series with the first amplifier and connected to receive output of the first amplifier;
   differential amplifiers connected to receive outputs from the first amplifier and the second amplifier, wherein the differential amplifiers provide opposite voltage outputs from the apparatus; and
   high-frequency compensation feed-forward paths connected to the first amplifier and the second amplifier.

16. The apparatus according to claim 15, wherein the high-frequency compensation feed-forward paths each comprises amplifiers and a capacitor.

17. The apparatus according to claim 15, wherein the high-frequency compensation feed-forward paths each comprise:
 a first frequency compensation amplifier;
 a second frequency compensation amplifier in series with the first frequency compensation amplifier;
 a feed-forward path connected to the second frequency compensation amplifier; and
 a capacitor in series with the first frequency compensation amplifier and the second frequency compensation amplifier.

18. The apparatus according to claim 17, wherein the second frequency compensation amplifier and the capacitor are outside the feed-forward path.

19. The apparatus according to claim 17, wherein an input node of the first frequency compensation amplifier is connected to a first node,
 wherein the capacitor is connected to a second node, and
 wherein the first node and the second node are in series with the first amplifier and the second amplifier.

20. The apparatus according to claim 15, wherein the differential amplifiers comprise at least one amplifier and a resistor/capacitor circuit.

* * * * *